(12) United States Patent
Arai et al.

(10) Patent No.: US 6,594,890 B2
(45) Date of Patent: Jul. 22, 2003

(54) METHOD OF SEPARATING A PLATE-LIKE WORKPIECE HELD BY ADHESION ON AN ELASTIC ADSORPTION PAD

(75) Inventors: Kazuhisa Arai, Tokyo (JP); Toshiaki Takahashi, Tokyo (JP); Kouichi Yajima, Tokyo (JP)

(73) Assignee: Disco Corporation, Tokyo (JP)

( * ) Notice: Subject to any disclaimer, the term of this patent is extended or adjusted under 35 U.S.C. 154(b) by 17 days.

(21) Appl. No.: 09/928,985

(22) Filed: Aug. 15, 2001

(65) Prior Publication Data

US 2002/0023340 A1 Feb. 28, 2002

(30) Foreign Application Priority Data

Aug. 29, 2000 (JP) ........................................ 2000-258945

(51) Int. Cl.[7] .......................... H05K 3/36; H01L 21/301
(52) U.S. Cl. ........................... 29/830; 29/825; 29/426.1; 438/464
(58) Field of Search ....................... 29/830, 825, 426.1; 438/463, 464, 460; 428/343

(56) References Cited

FOREIGN PATENT DOCUMENTS

| JP | 10-118920 | 5/1998 |
|----|-----------|--------|
| JP | 2000-25881 | 1/2000 |
| JP | 2000-158334 | 6/2000 |

*Primary Examiner*—Carl J. Arbes
*Assistant Examiner*—Thiem D Phan
(74) *Attorney, Agent, or Firm*—Smith, Gambrell & Russell, LLP

(57) ABSTRACT

A method of separating a plate-like workpiece held by adhesion on an elastic adhesive pad from the pad. The elastic adhesive pad has innumerable pores in its surface and generates adhesive force when negative pressure is produced by the pores, after being crushed, by restoration force generated by elasticity and adhesion. The method includes the step of heating the elastic adhesive pad at a predetermined temperature to separate the plate-like workpiece from the elastic adhesive pad by air expanding in the pores.

7 Claims, 4 Drawing Sheets

METHOD OF SEPARATING A PLATE-LIKE WORKPIECE HELD BY ADHESION ON AN ELASTIC ADSORPTION PAD

FIELD OF THE INVENTION

The present invention relates to a method of separating a plate-like workpiece such as a semiconductor wafer that is held by adhesive on an elastic adhesive pad, from the elastic adhesive pad which has innumerable pores formed in the surface and generates adhesive force when negative pressure is produced by the pores crushed by restoration force generated by elasticity and adhesion.

DESCRIPTION OF THE PRIOR ART

In the production process of a semiconductor device, a circuit such as an IC or LSI is formed in a large number of areas arranged in a lattice form on the surface of a substantially disk-like semiconductor wafer and each area having the circuit formed therein is diced along predetermined cutting lines to produce a semiconductor chip. To improve the heat radiation property of the semiconductor chip, the thickness of the semiconductor chip is desirably made as small as possible. To enable the downsizing of portable telephones, smart cards, personal computers and the like in which a large number of semiconductor chips are used, the semiconductor chip is desirably formed as thin as possible. To this end, before the semiconductor wafer is divided into chips, the back side of the semiconductor wafer is ground to a predetermined thickness. As a technology capable of further reducing the thickness of the semiconductor chip to be divided, there has also been developed a processing method so-called "pre-dicing" which comprises forming dicing grooves having a predetermined depth in the surface of the semiconductor wafer before the grinding of the back side of the semiconductor wafer, and grinding the back side of the semiconductor wafer until the dicing grooves are exposed to divide the semiconductor wafer into semiconductor chips.

The semiconductor wafer or semiconductor chips formed thin as described above are easily broken due to reduced rigidity and hence, considerable care must be taken in handling them in the processing step. The applicant has proposed in Japanese Laid-open Patent Applications 25881/2000 and 158334/2000 (JP-A 2000-25881 and JP-A 2000-158334) a tray comprising an elastic adhesive pad with innumerable pores in the surface for adhesive-holding a plate-like workpiece, making use of negative pressure produced when the pores are crushed by restoration force generated by elasticity and adhesion, in order to enable a thin plate-like workpiece having low rigidity to be carried easily.

When the plate-like workpiece held by adhesion on the tray comprising an elastic adhesive pad is to be separated from the elastic adhesive pad after it has been carried to the predetermined processing step, negative pressure in the pores formed in the surface of the elastic adhesive pad is reduced by supplying air to the elastic adhesive pad, whereby the plate-like workpiece is separated from the elastic adhesive pad. However, in the above method of supplying air to the elastic adhesive pad, it is difficult to supply air to all the pores formed innumerably in the surface of the elastic adhesive pad and considerable suction force may often remain in the elastic adhesive pad. In this case, when the plate-like workpiece is very thin and has low rigidity like a semiconductor wafer or semiconductor chip, it is liable to suffer damage at the time of separation from the elastic adhesive pad.

SUMMARY OF THE INVENTION

It is an object of the present invention to provide a method of separating a plate-like workpiece held by adhesion on an elastic adhesive pad, which is capable of separating a plate-like workpiece held by adhesion on an elastic adhesive pad easily.

To attain the above object, according to the present invention, there is provided a method of separating a plate-like workpiece held by adhesion on an elastic adhesive pad from the elastic adhesive pad that has innumerable pores in the surface and generates adhesive force when negative pressure is produced by the pores crushed by restoration force generated by elasticity and adhesion, which comprises the step of separating the plate-like workpiece from the elastic adhesive pad in a state of air in the pores being expanded by heating the elastic adhesive pad at a predetermined temperature.

The above elastic adhesive pad is mounted on a substrate and the substrate is placed on a heating table to heat the elastic adhesive pad via the substrate. Alternatively, the above elastic adhesive pad is mounted on the substrate, and the substrate is provided with a heating element to heat the elastic adhesive pad by heat generated by the heating element. Further alternatively, either one of a hot gas, hot liquid and infrared radiation is supplied to the above elastic adhesive pad to heat the elastic adhesive pad. The heating temperature of the elastic adhesive pad is desirably 40° C. to 60° C.

DETAILED DESCRIPTION OF THE PREFERRED EMBODIMENTS

Preferred embodiments of the method of separating a plate-like workpiece held by adhesion on an elastic adhesive pad according to the present invention will be described in detail with reference to the accompanying drawings hereinafter.

Figure 1:
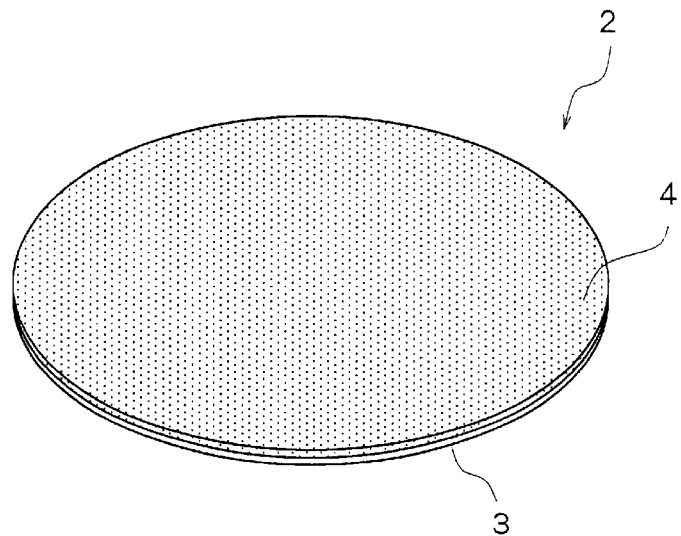
FIG. 1 is a perspective view of a plate-like workpiece holding tray that comprises an elastic adhesive pad.
Figure 2:
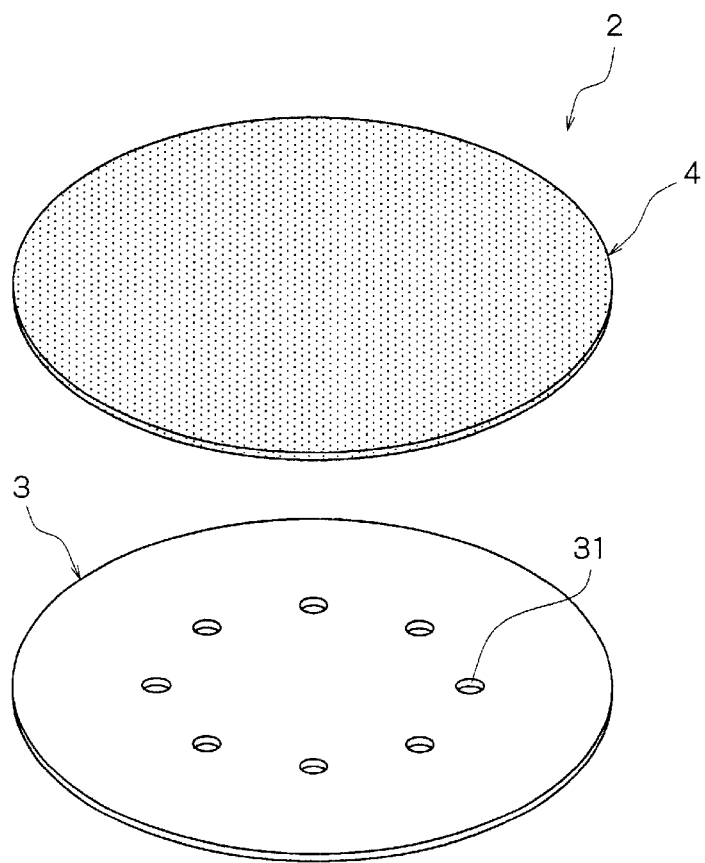
FIG. 2 is an exploded perspective view of the constituent members of the plate-like workpiece holding tray shown in FIG. 1.
Figure 3:
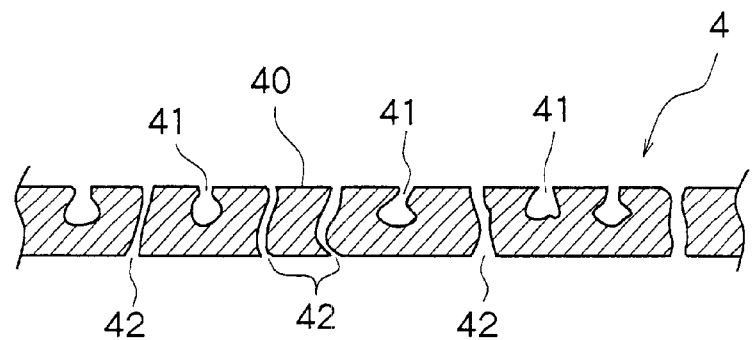
FIG. 3 is an enlarged sectional view of the elastic adhesive pad constituting the plate-like workpiece holding tray shown in FIG. 1.

A plate-like workpiece holding tray 2 which comprises an elastic adhesive pad for holding a plate-like workpiece such as a semiconductor wafer or the like will be first described with reference to FIGS. 1 to 3.

The plate-like workpiece holding tray 2 in the illustrated embodiment consists of a disk-like substrate 3 and a disk-like elastic adhesive pad 4 mounted on the top surface of the substrate 3. The substrate 3 is made from a hard material such as aluminum or synthetic resin, has a thickness of approximately 1 mm and is constructed such that it does not bend easily. A plurality of through holes 31 penetrating through from the upper surface to lower surface are formed in the thus formed substrate 3. Although the substrate 3 is formed circular (disk-like) in the illustrated embodiment, the substrate 3 is desirably formed in conformity with the shape of a plate-like workpiece to be held by adhesion thereon.

The above elastic adhesive pad 4 is formed from a material having elasticity such as a synthetic resin, for example, alkylbenzenesulfonic acid in conformity with the shape of the substrate 3. Innumerable pores 41 are formed at least in the surface 40 of the thus formed elastic adhesive pad 4 as shown in the enlarged view of FIG. 3. Through holes 42 having a width of several tens of micrometers and penetrating through from the upper surface to lower surface are formed between adjacent pores 41 of the elastic adhesive pad 4 so that air can pass through the through holes 42. The thickness of the elastic adhesive pad 4 is determined in consideration of the properties of a workpiece but it is preferably approximately 0.5 mm. The elastic adhesive pad 4 is available from Dars bond Co., Ltd., for example.

Figure 4:
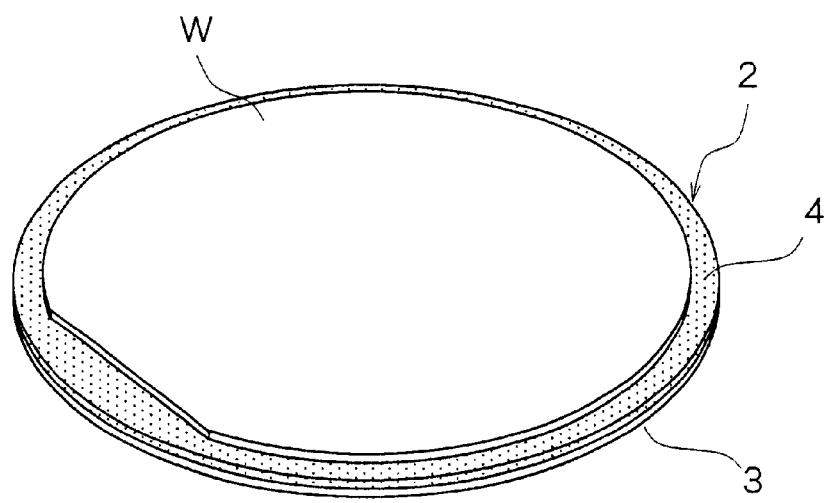
FIG. 4 is a perspective view showing a state of a plate-like workpiece being held by adhesion on the plate-like workpiece holding tray shown in FIG. 1.

The elastic pad 4 constituted as described above is fixed on the top surface of the above substrate 3 by using an appropriate adhesive to constitute the plate-like workpiece holding tray 2 which consists of the substrate 3 and the elastic pad 4 integrated with each other. The plate-like workpiece holding tray 2 constituted as described above works in such a way that when a plate-like workpiece W such as a semiconductor wafer or the like is placed on the top surface of the elastic adhesive pad 4 as shown in FIG. 4 and negative pressure is introduced through the through holes 31 formed in the substrate 3 by an appropriate negative pressure means, the negative pressure acts on the plate-like workpiece W placed on the top surface of the elastic adhesive pad 4 through the through holes 42 formed in the elastic adhesive pad 4 to let the plate-like workpiece W adsorb the elastic adhesive pad 4. At this point, the elastic adhesive pad 4 is compressed and the pores 41 formed in the surface 40 are crushed. As a result, negative pressure is produced in the pores 41 by restoration force generated by elasticity and adhesion of the elastic adhesive pad 4 even when the introduction of negative pressure through the through holes 31 formed in the substrate 3 of the plate-like workpiece holding tray 2 is released. Thus, this negative pressure serves as suction force for keeping the adhesive of the plate-like workpiece W. Tohold by adhesion the plate-like workpiece W on the elastic adhesive pad 4 of the plate-like workpiece holding tray 2, after the plate-like workpiece W is placed on the elastic adhesive pad 4, the plate-like workpiece W is thrusted to crush the above pores 41, thereby making it possible to generate adhesive force in the elastic adhesive pad 4.

Figure 5:
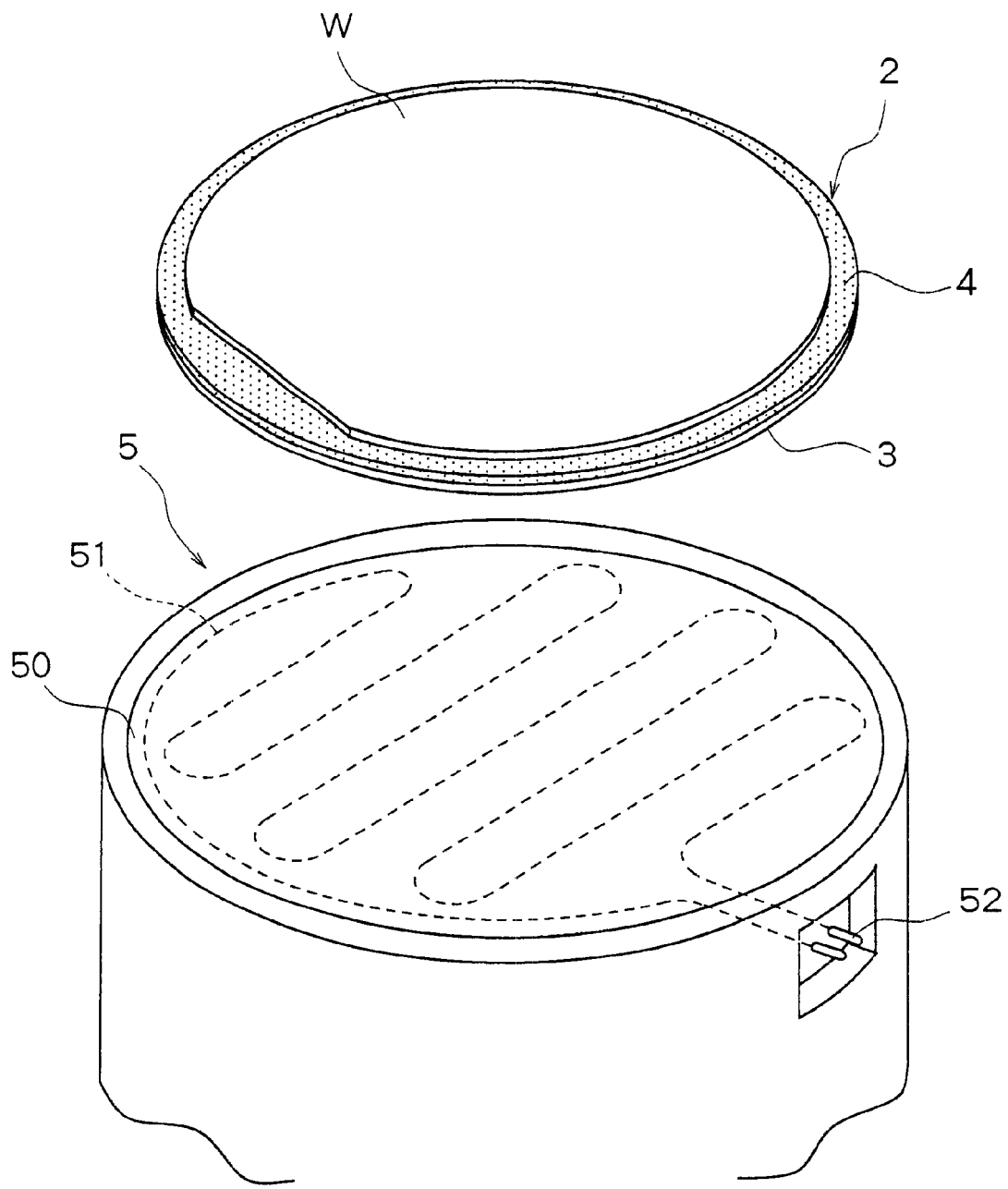
FIG. 5 is a perspective view showing a heating table as a heating means for carrying out the separation method of the present invention.

Referring to FIG. 5, a description is subsequently given of an embodiment of the method of separating the plate-like workpiece W from the plate-like workpiece holding tray 2 after the plate-like workpiece W held by adhesion on the plate-like workpiece holding tray 2 which comprises the elastic adhesive pad 4 is carried to the predetermined processing step as described above.

In the embodiment shown in FIG. 5, a heating table 5 is prepared. This heating table 5 comprises a heating portion 50 formed from an insulating material such as a ceramic and a heating wire 51 embedded in the heating portion 50, and the heating wire 51 is connected to a power source (not shown) via a connection terminal 52. The substrate 3 of the plate-like workpiece holding tray 2 that holds by adhesion the plate-like workpiece W is placed on the top surface of the heating table 5 constituted as described above, and the heating wire 51 is energized through the connection terminal 52. As a result, the top surface of the heating table 5 is heated to heat the elastic adhesive pad 4 via the substrate 3 of the plate-like workpiece holding tray 2. When the elastic adhesive pad 4 is heated, air remaining in the pores 41 expands, thereby canceling the negative pressure produced in all the pores 41. Therefore, the plate-like workpiece W held on the top surface of the elastic adhesive pad 4 of the plate-like workpiece holding tray 2 can be easily separated from the elastic adhesive pad 4. The heating temperature of the elastic adhesive pad 4 is sufficient if it allows air remaining in the pores 41 to expand to such an extent that the above negative pressure is canceled. According to experiments conducted in the present invention, it is preferably 40° C. to 60° C. which does not affect the quality of a semiconductor wafer or semiconductor chip as the plate-like workpiece W.

Another embodiment of the method of separating the plate-like workpiece W held by adhesion on the plate-like workpiece holding tray 2 which comprises the above elastic adhesive pad 4 will be described with reference to FIG. 6 and FIG. 7.

Figure 6:
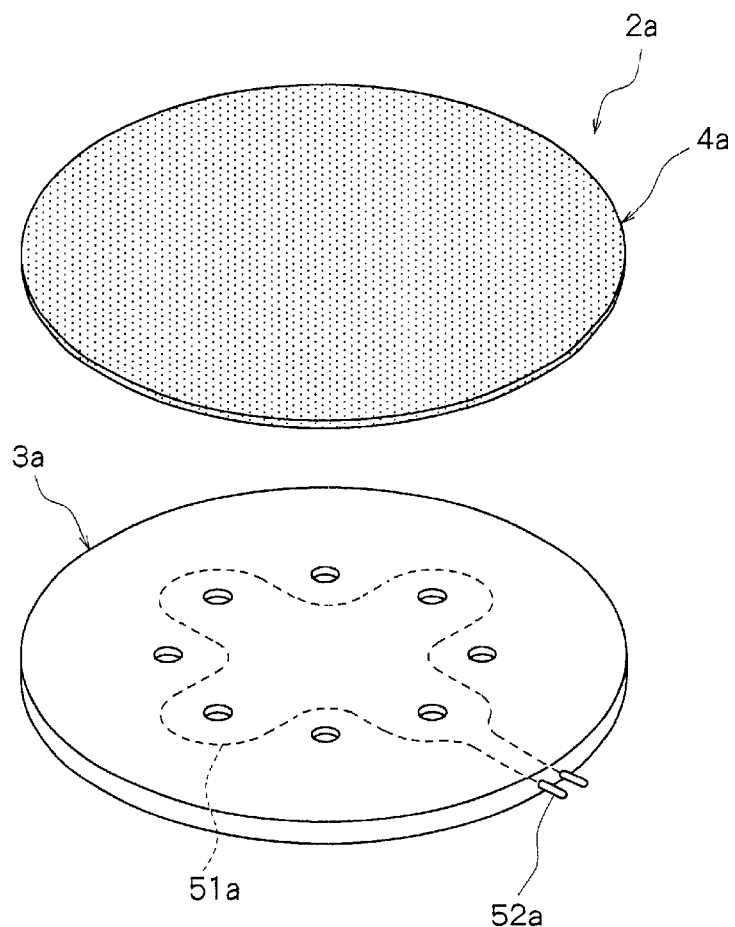
FIG. 6 is an exploded perspective view of another embodiment of the plate-like workpiece holding tray for carrying out the separation method of the present invention.
Figure 7:
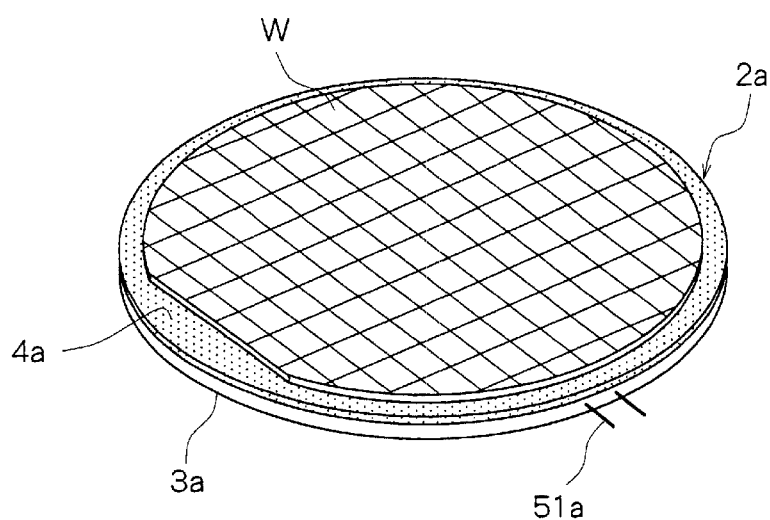
FIG. 7 is a perspective view showing a state of the plate-like workpiece being held by adhesion on the plate-like workpiece holding tray shown in FIG. 6.

In the embodiment shown in FIG. 6 and FIG. 7, a plate-like workpiece holding tray 2a is provided with a heating means. That is, the plate-like workpiece holding tray 2a which consists of a substrate 3a and an elastic adhesive pad 4a mounted on the top surface of the substrate 3a is constituted such that a heating wire 51a is embedded in the substrate 3a and connected to a power source (not shown) via a connection terminal 52a. Therefore, when the plate-like workpiece W such as a semiconductor chip formed by dividing a semiconductor wafer, which is held by adhesion on the elastic absorption pad 4a as shown in FIG. 7, is to be separated from the elastic adhesive pad 4a, the elastic adhesive pad 4a can be heated via the substrate 3a by energizing the heating wire 51a through the connection terminal 52a. As a result, air remaining in the pores 41 of the elastic adhesive pad 4a expands, thereby making it possible to cancel negative pressure produced in the pores 41 and to separate the plate-like workpiece W from the elastic adhesive pad 4a easily. To embed the heating wire 51a in the substrate 3a of the plate-like workpiece holding tray 2a shown in FIG. 6 and FIG. 7, the substrate 3a is desirably formed from an insulating material such as a ceramic and must be formed thicker than that of the embodiment shown in FIG. 1.

A description is subsequently given of still another embodiment of the method of heating the elastic adhesive pad 4 in the present invention.

In the embodiment shown in FIG. 5 and FIG. 6, the heating wire which generates heat by energization is used as a means of heating the elastic adhesive pad 4 which holds by adhesion the plate-like workpiece W. A hot gas or hot liquid heated at a predetermined temperature may be used as another heating means or infrared radiation may also be used to heat the elastic absorption pad 4.

Since the method of separating the plate-like workpiece held by adhesion on the elastic adhesive pad according to the present invention is constituted as described above, the following function and effect are obtained.

That is, according to the present invention, when the plate-like workpiece held by adhesion on the elastic adhesive pad is to be separated from the elastic adhesive pad, it is separated from the elastic adhesive pad in a state of air remaining in the pores formed in the surface of the elastic adhesive pad being expanded by heating the elastic adhesive pad at a predetermined temperature. Therefore, negative pressure produced in the pores can be canceled, thereby making it possible to easily separate the plate-like workpiece from the elastic adhesive pad. Since the plate-like workpiece can be separated from the elastic adhesive pad easily, it is not damaged at the time of separation.

What is claimed is:

1. A method of separating a plate-like workpiece held by adhesion on an elastic adhesive pad from the elastic adhesive pad, the elastic adhesive pad having numerous pores in the surface and generating adhesive force when negative pressure is produced by the pores when crushed by restoration force generated by elasticity and adhesion, which method comprises the step of separating the plate-like workpiece from the elastic adhesive pad by air in the pores being expanded by heating the elastic adhesive pad to a predetermined temperature.

2. The method as set forth in claim 1, wherein the elastic adhesive pad is mounted on a substrate and the substrate is placed on a heating table to heat the elastic adhesive pad via the substrate.

3. The method as set forth in claim 1, wherein the elastic adhesive pad is mounted on a substrate and the substrate is provided with a heating element to heat the elastic adsorption pad by heat generated by the heating element.

4. The method as set forth in claim 1, wherein one of a hot gas, hot liquid and infrared radiation is supplied to the elastic adhesive pad to heat the elastic adhesive pad.

5. The method as set forth in claim 1, wherein the heating temperature of the elastic adhesive pad is 40° C. to 60° C.

6. The method as set forth in claim 1, wherein the plate-like workpiece is a semiconductor wafer.

7. The method as set forth in claim 1, wherein the plate-like workpiece is a semiconductor chip.

* * * * *